United States Patent [19]

Tokuda

[11] Patent Number: 5,228,003
[45] Date of Patent: Jul. 13, 1993

[54] SEMICONDUCTOR MEMORY

[75] Inventor: Yasunobu Tokuda, Nagano, Japan

[73] Assignee: Seiko Epson Corporation, Tokyo, Japan

[21] Appl. No.: 886,348

[22] Filed: May 21, 1992

Related U.S. Application Data

[63] Continuation of Ser. No. 515,341, Apr. 30, 1990, abandoned, which is a continuation of Ser. No. 336,817, Apr. 13, 1989, abandoned.

[30] Foreign Application Priority Data

Apr. 15, 1988 [JP] Japan ................................. 094122

[51] Int. Cl.$^5$ ........................... G11C 7/00; G11C 8/00
[52] U.S. Cl. ............................ 365/233.5; 365/189.01; 365/191; 365/194; 365/203
[58] Field of Search ................. 365/233, 233.5, 230.01, 365/191, 189.01, 193, 194, 195, 203

[56] References Cited

U.S. PATENT DOCUMENTS

| | | | |
|---|---|---|---|
| 4,337,525 | 6/1982 | Akatsuka | 365/233 |
| 4,893,282 | 1/1990 | Wada et al. | 365/233.5 |
| 4,916,668 | 4/1990 | Matsui | 365/230.01 |
| 4,922,122 | 5/1990 | Dubujet | 365/233.5 X |
| 4,961,172 | 10/1990 | Shubat et al. | 365/230.06 |
| 4,962,487 | 10/1990 | Suzuki | 365/195 |
| 4,982,366 | 1/1991 | Takemae | 365/195 |

FOREIGN PATENT DOCUMENTS 0145582 6/1985 European Pat. Off. .
61-267991 4/1987 Japan .

OTHER PUBLICATIONS

"Address Transition Detection Enhancement Circuit", IBM Technical Disclosure Bulletin, vol. 30, No. 8, Jan. 1988.

Primary Examiner—Alyssa H. Bowler
Attorney, Agent, or Firm—Spensley Horn Jubas & Lubitz

[57] ABSTRACT

A semiconductor memory adapted to receive a chip selection signal and address signal, composed of: a signal generating circuit for generating inner selection signals with respect to the chip selection signal, a pulse generating circuit for detecting any changes in the address signals and generating a pulse signal; and a pulse width changing circuit for inputting the pulse signal to output a control signal for precharging or equalizing the data lines of a memory cell array. The pulse width changing circuit outputs the control signal having a pulse whose pulse width corresponds to what is obtained by converting the pulse width of the pulse signal into a longer one when the inner selection signals are in the chip-selecting condition.

15 Claims, 8 Drawing Sheets

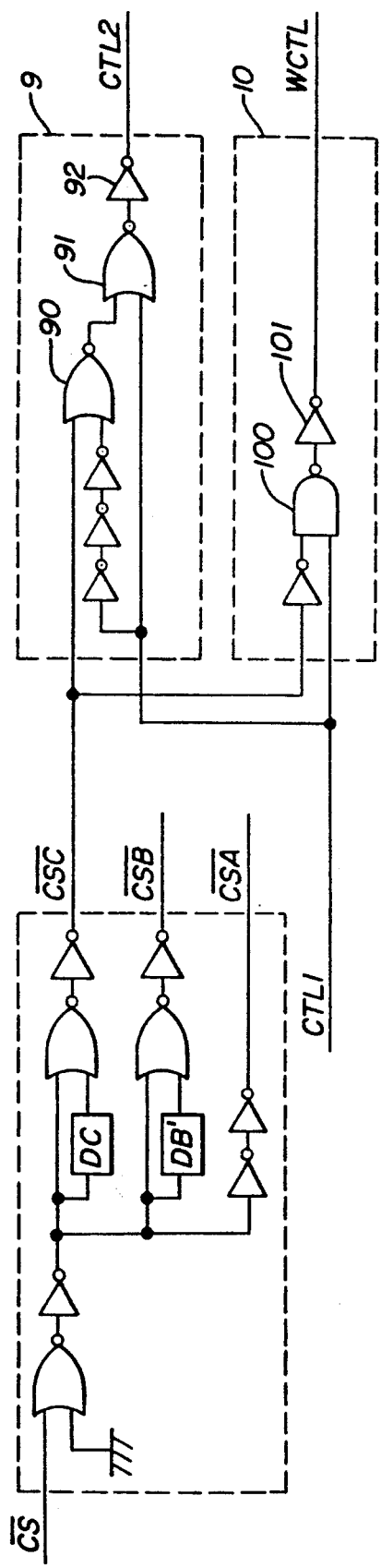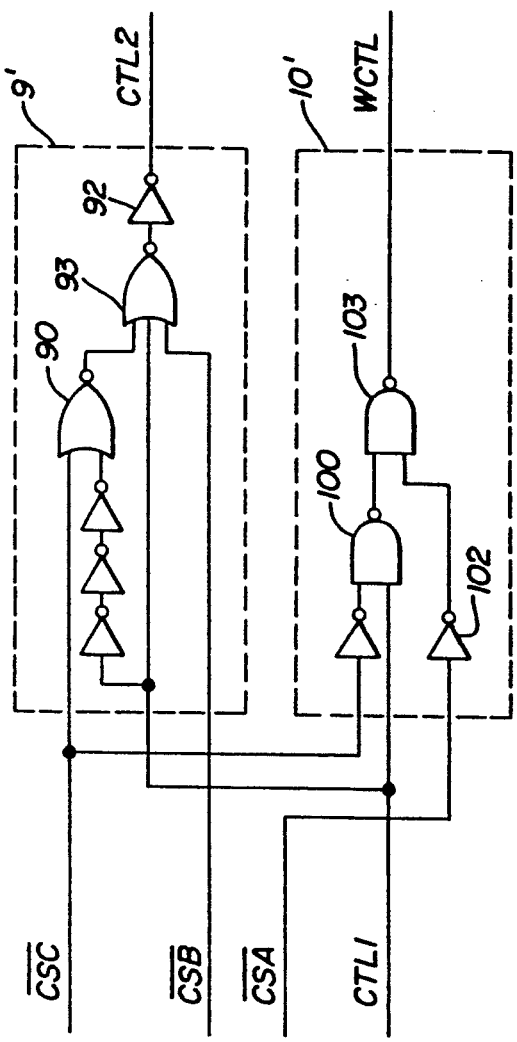
FIG. 2
FIG. 3

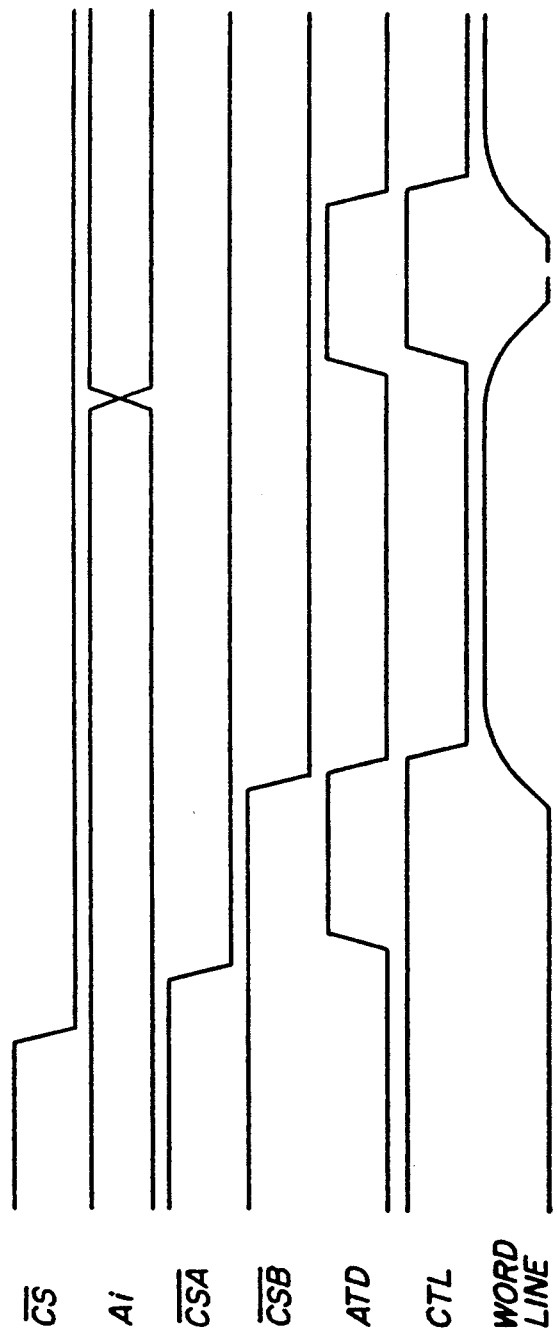

SEMICONDUCTOR MEMORY

This is a continuation of application Ser. No. 07/515,341, filed on Apr. 30, 1990 which is a continuation of application Ser. No. 07/336,817, filed on Apr. 13, 1989, both now abandoned.

BACKGROUND OF THE INVENTION

1. Field of the Invention

This invention relates to a semiconductor memory equipped with a chip selection signal terminal, and in particular to a semiconductor memory in which the access time as counted from the input of a chip selection signal is reduced.

2. Description of the Related Art

FIG. 6(a) is a block diagram of a conventional semiconductor memory including a memory cell array and a precharger/equalizer which are shown in detail in FIG. 6(b). $\overline{CS}$ represents the chip selection signal which is applied to a selection signal generating circuit 1. The H (High) level of this signal indicates the nonselecting condition, the memory circuit being in the stand-by condition, the inner selection signal $\overline{CSA}$ being at the H level. When signal $\overline{CSA}$ is at the H level, the operation of an address input buffer circuit 2 is inhibited and the operation of a decoder 4 is halted, keeping the level of the word and column select lines, which constitute the selection lines of memory cell array 6, at their lower level.

CTL is a control signal for circuit operation, controlling the operation of a precharger/equalizer 5 for the data lines for transmitting the data of memory cell array 6 as well as the operations of a data amplifier 7 and an output circuit 8. In the stand-by condition, signal CTL is at the H level, the data lines being precharged and equalized. At the same time, the operation of circuits 7 and 8 is stopped. When the signal $\overline{CS}$ is at the H level, the signal $\overline{CSB}$ is at the H level, keeping CTL at the H level. Further, a pulse signal generator 3 is provided so that operation may also be effected when changes occur in the address signals Ai supplied to circuit 2.

FIG. 7 shows concrete circuit examples of the selection signal generator 1, the address input buffer circuit 2 and the pulse signal generator 3. The signal $\overline{CSA}$ is input to input NOR gates 20 for the address signals, preventing changes in signals Ai from being transmitted to the inside of the circuit when $\overline{CSA}$ is at the H level. Any change in Ai when $\overline{CSA}$ is low (L level) is detected by the circuit 3 with respect to the rise and fall of the signal, a pulse signal ATD being generated for each address to perform OR operation of the signals ATD for all the addresses. The signal ATD associated with each address signal Ai (i=o...n) is supplied to a respective input device of OR circuit 3-2. When signal $\overline{CS}$ goes low, the corresponding drop in $\overline{CSB}$ is delayed by the delay circuit DB of selection signal generator 1; when $\overline{CSB}$ drops to the L (Low) level, a P-channel MOS transistor 3-1 is turned on, causing the OR circuit 3-2 to operate. When $\overline{CSB}$ is at the H level, P-channel MOS transistor 3-1 is turned off and current is not supplied to OR circuit 3-2.

Next, the operation of the circuit shown in FIG. 6(a) will be described with reference to the timing chart of FIG. 8. When the signal level of $\overline{CS}$ is changed from the H to the L level, $\overline{CSA}$ is changed to the L level, an address signal Ai being transmitted to the inside of the circuit through the associated input NOR gate 20. When Ai is at the L level, a change occurs in the inside address signal, generating an ATD pulse. CTL level is lowered at the termination of the ATD pulse; if the Ai's are all at the H level and no ATD pulse is generated, the CTL lowering time does not change since $\overline{CSB}$ is lowered simultaneously with the ATD pulse lowering. The address signals Ai are transmitted to decoder 4, and the signal level of the word lines and the column select lines which lead to the memory cells to be selected is raised. As is well known, the word lines are connected to the memory cells to select those memory cells which are in the ROW direction. The column select lines select the data lines which are connected to the column of the memory cell to be selected. The information stored in the memory cells then appears on the data lines, and is output to the output terminal through amplifier 7 and output circuit 8.

When an address signal Ai changes while $\overline{CS}$ remains at the L level, an ATD pulse is generated, causing the CTL to be raised to the H level so that precharging and equalization of the data lines are effected. Readout of data from the next address is then performed.

In conventional semiconductor memories with such a construction as described above, the $\overline{CS}$ access timing when the address signal Ai is at the L level is such that when $\overline{CS}$ changes to the L level and the $\overline{CSA}$ level is consequently lowered, the output of the corresponding address input NOR gate 20 changes. In the case of $\overline{CS}$ access, access is started at this time. In the case of address access, the output of NOR gate 20 changes when the address signal Ai changes since $\overline{CSA}$ is already at the L level, thus starting access. Accordingly, the $\overline{CS}$ access is more delayed than the address access by the time between lowering of $\overline{CS}$ and the resultant lowering of $\overline{CSA}$.

In the case of $\overline{CS}$ access, the data line is already precharged and equalized, access being started in this condition. Accordingly, there is no particular limit to the speed-up of the signal level rise of the word lines and the column select lines; the faster the rise, the better.

It would be advantageous, if, in a conventional semiconductor memory, the $\overline{CSB}$ drop could occur at a shorter time after a $\overline{CS}$ drop, so that the width of the ATD pulse diminished, thereby speeding up the operation of the address input buffer 2 and of the decoder 4. However, in a conventional semiconductor memory, reducing the width of the ATD pulse results in the pulse width of the CTL being also diminished. In the case of address access, however, there is a danger of the wrong data being written to the memory cell selected next, thereby destroying the stored data, unless the data lines are kept in the reset condition for a sufficient length of time through precharging and equalization by the CTL since the data of the previous cycle remains on the data line. Further, it is not sufficient for the operation of data amplifier 7 and of output circuit 8 to be inhibited for a short period of time by CTL since that will cause amplifier 7 to be operated before the data appears on the data line to a sufficient degree, which will cause malfunctions due to noises, resulting in a delayed access time.

Thus, it has been impossible in conventional semiconductor memories to speed up the $\overline{CS}$ access by diminishing the width of the ATD pulse since that involves the above-mentioned problem at the time of address access.

SUMMARY OF THE INVENTION

It is therefore an object of the invention to alleviate the above-mentioned problem encountered in conventional semiconductor memories.

A more specific object of this invention is to provide a semiconductor memory in which a high-speed $\overline{CS}$ access is realized and a stable address-access operation is maintained.

The above and other objects are achieved, according to the present invention, by a semiconductor memory actuatable in response to a chip selection signal and address signals, comprising:

a memory cell array having data lines;

a selection signal generating circuit connected for generating inner selection signals in response to the chip selection signal, each inner selection signal having an associated chip selecting state;

a control signal generating circuit connected for detecting changes in the address signals and generating a first control signal containing a pulse in response to each address signal change; and a pulse width changing circuit connected for deriving from the first control signal a second control signal containing pulses for controlling the data lines of the memory cell array, each pulse of the second control signal corresponding to a respective pulse of the first control signal, wherein the pulse width changing circuit comprises means for causing each pulse of the second control signal to have a longer duration than the corresponding pulse of the first control signal when the inner selection signals are in the chip-selecting state.

BRIEF DESCRIPTION OF THE DRAWINGS

FIG. 2 is a circuit diagram showing embodiments of the pulse signal generating circuit, the pulse width changing circuit and the selection line control circuit of the memory of FIG. 1.

FIG. 3 is a circuit diagram showing other embodiments of the pulse width changing circuit and the selection line control circuit of the memory of FIG. 1;

FIG. 8 is a timing chart illustrating the operation of the conventional semiconductor memory of FIGS. 6 and 7.

DESCRIPTION OF THE PREFERRED EMBODIMENTS

Figure 1:
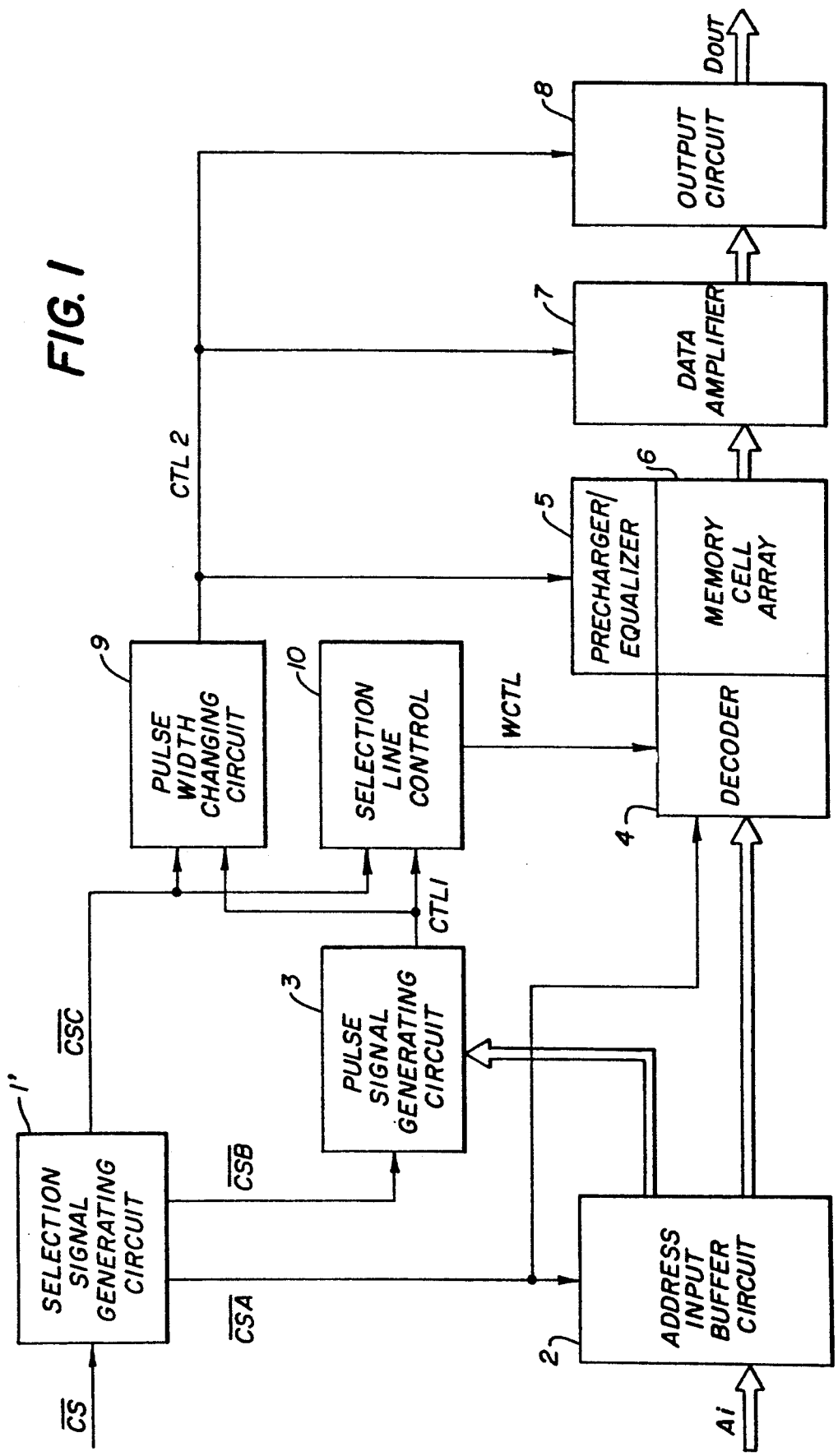
FIG. 1 is a block diagram of a semiconductor memory in accordance with this invention.
Figure 5:
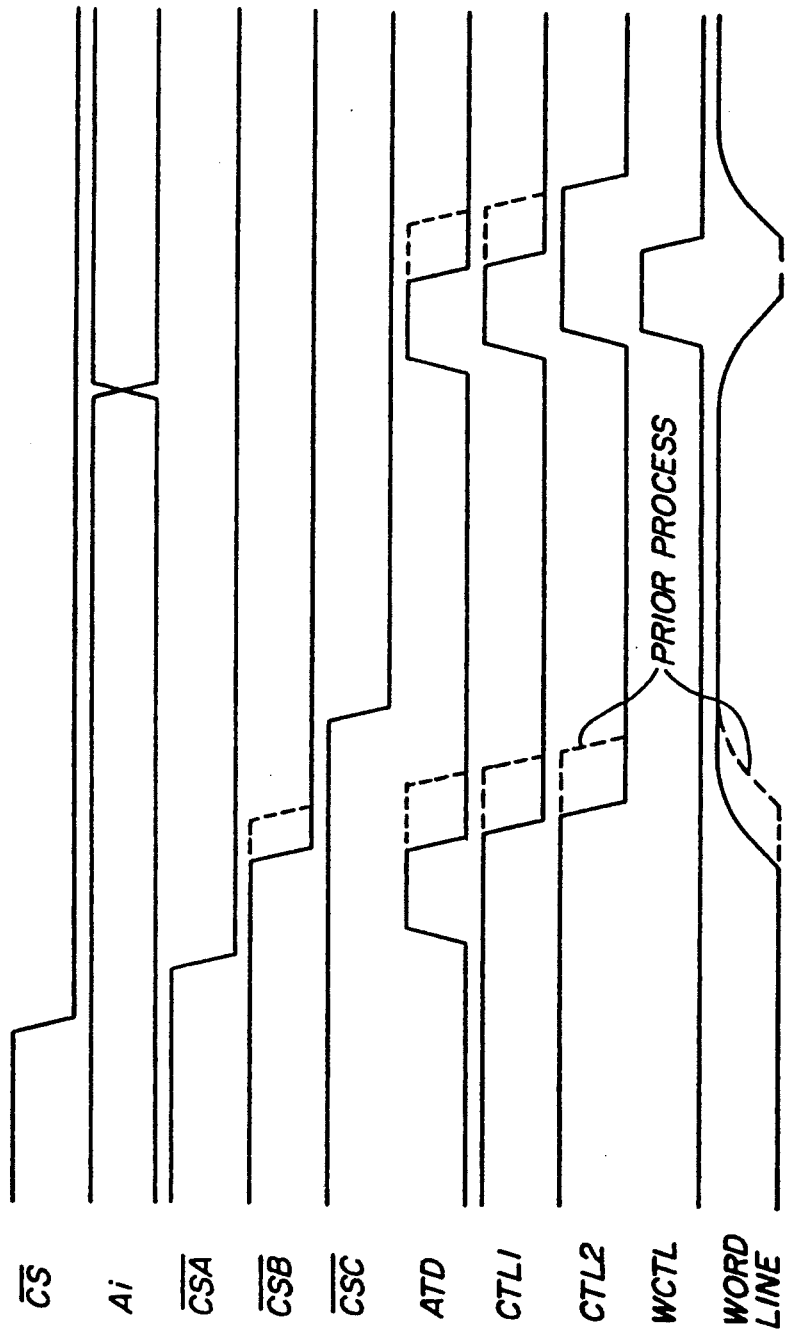
FIG. 5 is a timing chart illustrating the operation of a semiconductor memory in accordance with this invention.

Embodiments of this invention will now be described with reference to the attached drawings. FIG. 1 is a block diagram of a semiconductor memory in accordance with this invention. FIG. 5 is a timing chart illustrating the operation of the circuit shown in FIG. 1. $\overline{CS}$ denotes the chip selection signal input to the chip selection signal terminal of the semiconductor memory, the signal being in the chip selecting condition when it is at the L (low) level, and in the nonselecting condition when it is at the H (high) level. When $\overline{CS}$ is input to a selection signal generating circuit 1', inner selection signals $\overline{CSA}$, $\overline{CSB}$ and $\overline{CSC}$ are generated, $\overline{CSC}$ being transmitted to a pulse width changing circuit 9 and a selection line control circuit 10. A signal CTL1 is generated by a pulse signal generating circuit 3 and is input to circuits 9 and 10. A signal CTL2, produced by circuit 9, controls the operation of a precharger/equalizer 5, a data amplifier 7 and an output circuit 8. The word and column selection line selecting operation is conducted by a decoder 4 for decoding address signals Ai. A selection line control signal WCTL, produced by circuit 10, effects active/inactive control of decoder 4.

Figure 7:
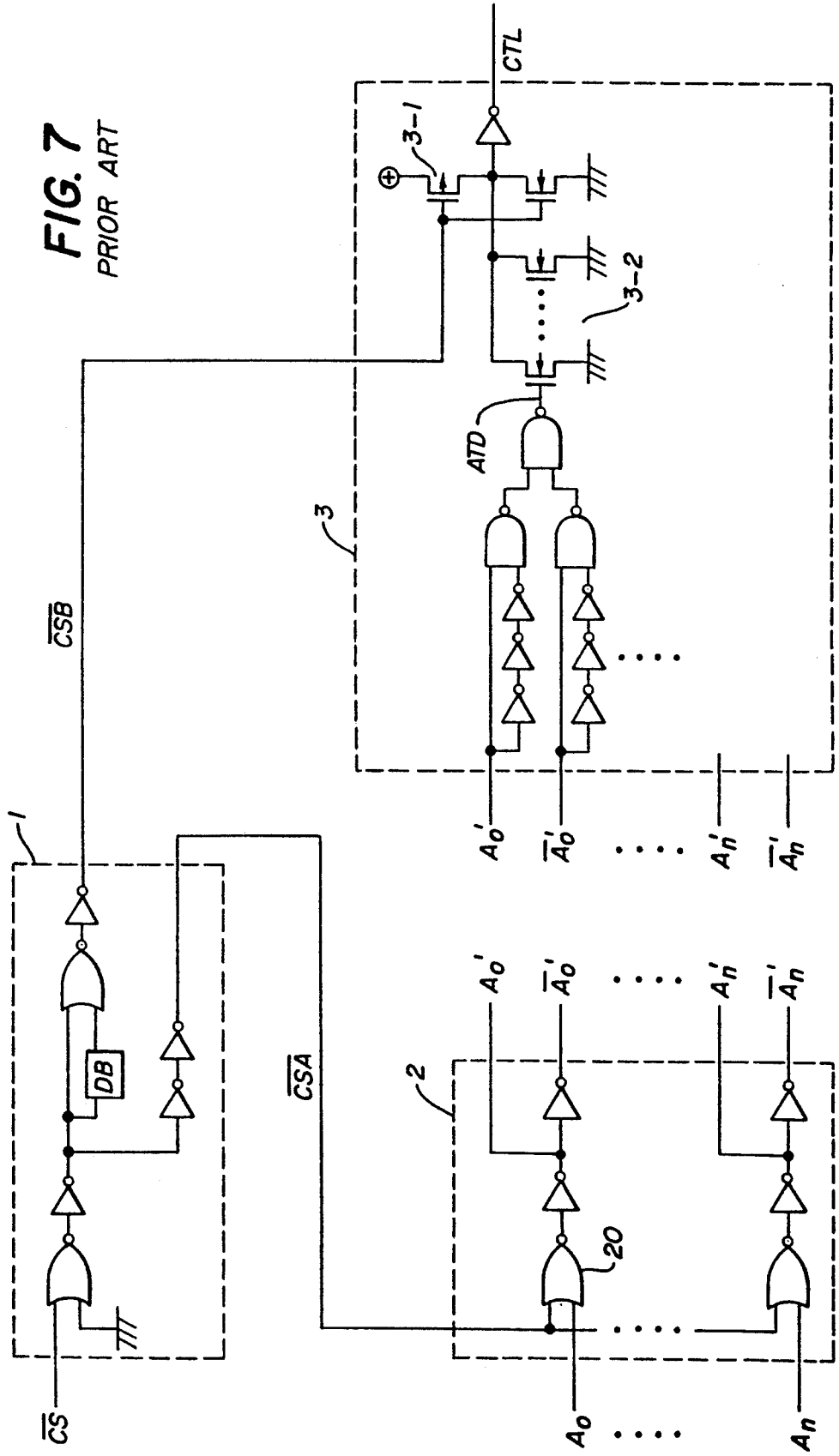
FIG. 7 is a circuit diagram showing a selection signal generating circuit, an input buffer circuit and a pulse signal generating circuit in the conventional semiconductor memory of FIGS. 6.

As in the conventional memory shown in FIG. 7, the selection signal generating circuit 1' generates the signal $\overline{CSB}$. However, the delay produced by delay circuit DB' of FIG. 1 is set shorter so that the $\overline{CSB}$ drop may be faster than in conventional memories. The embodiment shown in FIG. 1 further includes an address input buffer circuit 2, the basic construction of which is the same as the conventional example shown in FIG. 7, except for the transistor size which is designed to be larger so as to realize a high-speed operation. Likewise, the basic construction of the pulse signal generating circuit 3 is the same as in the conventional memory shown in FIG. 7, except for the fact that the number of inverter stages is reduced so as to diminish the width of the ATD pulse, thereby reducing the delay.

Figure 6A:
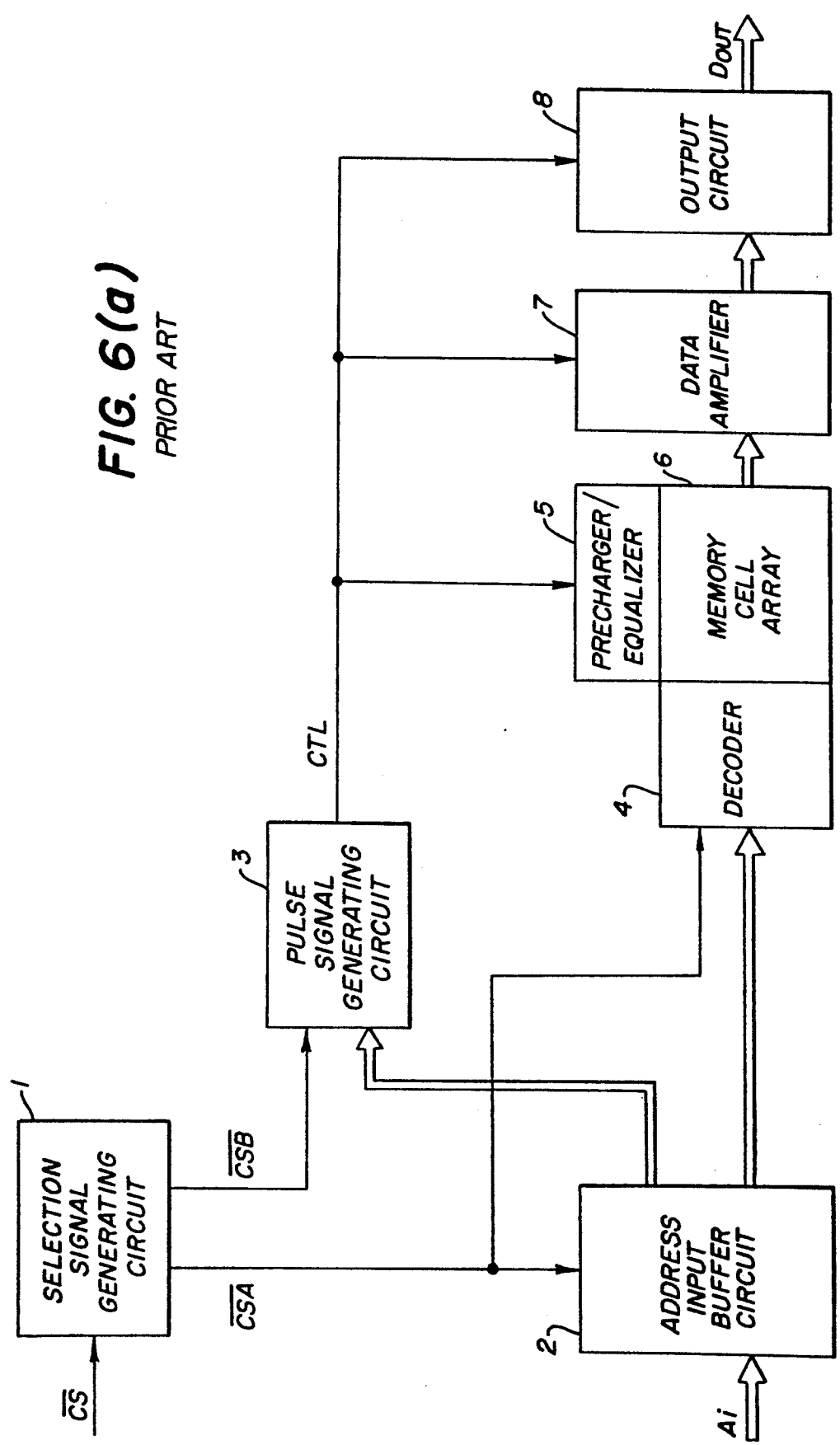
FIGS. 6(a) and 6(b) are block diagrams illustrating a conventional semiconductor memory.
Figure 6B:
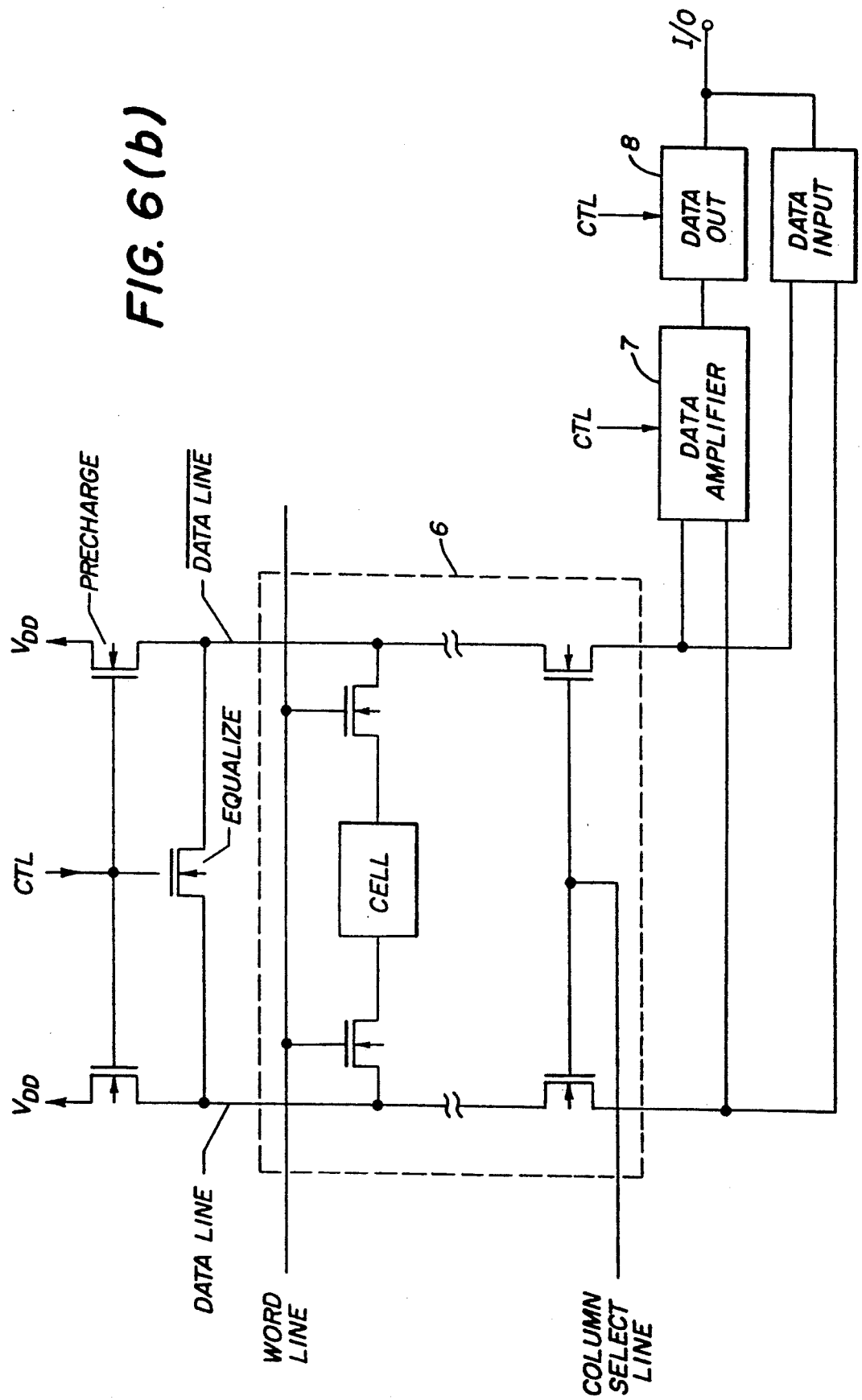

FIG. 2 shows embodiments of the selection signal generating circuit 1', the pulse width changing circuit 9 and the selection line control circuit 10. A drop in the signal $\overline{CSC}$ is delayed by a delay circuit DC. When $\overline{CSC}$ is at the H level in circuit 9, the level of CTL1 determines the level of CTL2 output through a NOR gate 91 and an inverter 92. When the $\overline{CSC}$ is at the L level, CTL1 is input to NOR gate 91 not only directly but also through a three-stage inverter and a NOR gate 90, OR operation being performed at NOR gate 91. Thus, the output of NOR gate 90 is delayed as a result of the signal passing through four gates in total, CTL2 then appearing as a signal having a correspondingly increased pulse width. When at the H level, CTL2 precharges and equalizes the data lines, like signal CTL in FIG. 6(b) inhibiting the amplification and output of data.

To avoid malfunction, the pulse width of CTL2 at the time of an address change should be sufficiently large; it must be set to a value approximately equal to the pulse width of the ATD and CTL in conventional memories. Since, according to the present invention, the ATD pulse width is relatively small, the pulse width changing circuit 9 serves to augment the pulse width. That is, the circuit 9 augments the pulse width when address access is performed with $\overline{CSC}$ at the L level. When $\overline{CS}$ access is performed with $\overline{CSC}$ starting at the H level, $\overline{CSC}$ does not delay the fall of CTL2 but it is caused to change quickly.

When, in the selection line control circuit 10, $\overline{CSC}$ is at the H level, WCTL is held at the L level. When $\overline{CSC}$ is at the L level, WCTL is constituted by CTL1, which is output through a NAND gate 100 and an inverter 101.

Thus, when $\overline{CSC}$ is at the H level, precharging and equalization are only performed for a short period of time, the word and column select lines not being deactivated. When $\overline{CSC}$ is at the L level, the long pulse of CTL 2 causes precharging and equalization to be performed for a long period, the word and column select lines being temporarily deactivated by WCTL so as to avoid malfunction at the time of address change.

The circuit diagram of FIG. 3 shows other embodiments of the pulse width changing circuit 9' and the selection line control circuit 10'. When, in the example shown in FIG. 3, an IC chip is nonselected, i.e., when $\overline{CS}$ is at the H level, CTL2 must be at the H level before precharging and equalization can be performed. Further, WCTL must be at the H level for the signal level of the word and column select lines to fall. In circuit 9', $\overline{CSB}$ is input to a NOR gate 93, and, in circuit 10', $\overline{CSA}$ is input to a NAND gate 103 through an inverter 102. Thanks to this arrangement, it is not necessary to input $\overline{CSB}$ to circuit 3 or $\overline{CSA}$ to the circuit 4 as in the embodiment shown in FIG. 1.

In other words, in the embodiment shown in FIG. 1, $\overline{CSB}$ is input to pulse signal generating circuit 3 to control CTL1, whereas in that shown in FIG. 3, $\overline{CSB}$ is input to the NOR gate 93 along with CTL1, the control by $\overline{CSB}$ being performed in circuit 9'. Further, while in the embodiment shown in FIG. 1 decoder 4 is controlled by $\overline{CSA}$, it is controlled by the WCTL when the circuit shown in FIG. 3 is used. Consequently, in the case of the example shown in FIG. 3, WCTL remains at the H level until the $\overline{CSA}$ falls, inhibiting operation of decoder 4.

Figure 4:
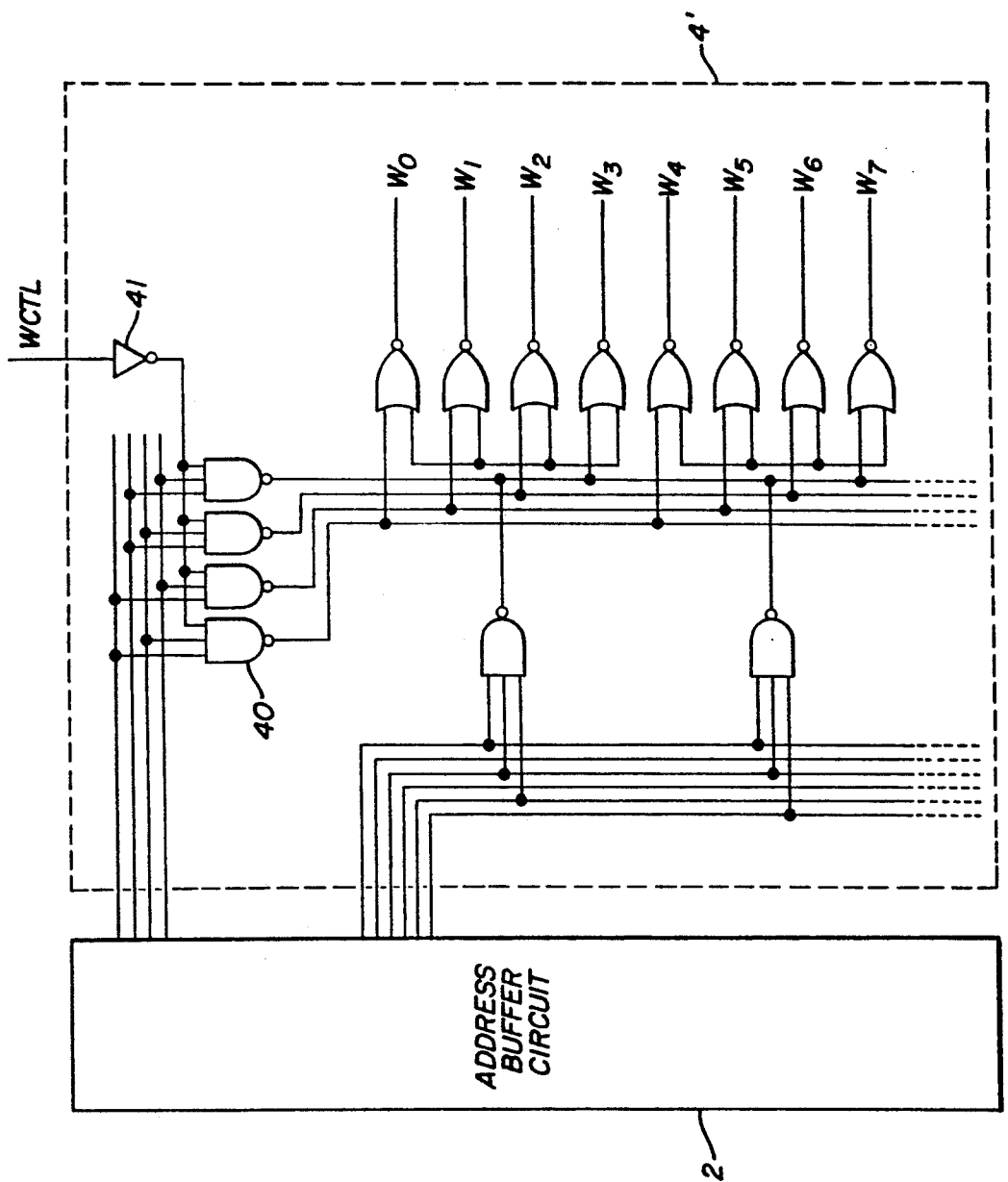
FIG. 4 is a circuit diagram showing an embodiment of the decoder of the memory of FIG. 1.

The circuit diagram of FIG. 4 shows an embodiment of the decoder 4' of this invention. In order to deactivate all the word lines by means of WCTL, WCTL is input to NAND gates 40 of decoder 4' through an inverter 41. When WCTL is at the H Level, the outputs of the NAND gates 40 are all at the H level, so that the word lines Wi are all at the L level. This also applies to the column select lines.

The operation of the circuit shown in FIG. 1 will now be described with reference to the timing chart of FIG. 5. When $\overline{CS}$ is at the H level, it implies that the memory is in the condition where the chip is nonselected. At this time, the signals $\overline{CSA}$, $\overline{CSB}$ and $\overline{CSC}$ are all at the H level. When $\overline{CS}$ is lowered to the L level, i.e., the selection condition is indicated, $\overline{CSA}$ is first lowered to the L level and the address signals Ai are output through address input buffer circuit 2, the address signals Ai being transmitted to the inside to generate an ATD pulse in pulse generating circuit 3. However, since $\overline{CSB}$ remains temporarily at the H level, CTL1 does not change and remains at the H level even when the ATD pulse is generated. When CTL1 is at the H level, CTL2 is also at the H level. CTL2 causes the precharger/equalizer 5 to precharge and equalize the data lines, the operation of the data amplifier 7 and that of the output circuit 8 being inhibited.

CTL1 falls together with $\overline{CSB}$. Since $\overline{CSC}$ is still at the H level when CTL1 falls, the inputs of the NOR gate 91 or NOR gate 93 are all at the L level, so CTL2 also falls following CTL1. This terminates the precharging and equalization, causing amplifier 7 and output circuit 8 to be activated. Since at this time WCTL remains at the low level, the NAND gates 40 in FIG. 4 are not inhibited by WCTL. Accordingly, the output of input buffer circuit 2 is decoded by decoder 4', thereby performing word line selection. Column select line selection is also performed in the same manner. Accordingly, the word line signal level rises in accordance with the operational speed of the address input buffer 2 and decoder 4', thereby performing memory cell selection. After that, $\overline{CSC}$ is lowered to the L level.

When Ai changes following data readout from an address and address access is started, an ATD pulse is generated in pulse signal generating circuit 3, CTL1 also changing following the ATD to become a pulse at the H level. Since at this time $\overline{CSC}$ and $\overline{CSB}$ are already at the L level, the pulse width changing circuit 9 or 9' operates. The pulse rise of CTL1 causes a rise of CTL2 through the NOR gate 91 or 93. On the other hand, fall of CTL1 pulse is input to NOR gate 91 or 93 after being delayed through the three-staged inverter and NOR gate 90. As a result, the fall of CTL2 is delayed. This is, as will be appreciated from FIG. 5, the CTL1 pulse is transformed into a longer pulse, CTL2.

At this time, the selection line control circuit 10 or 10' also operates, a pulse appearing on WCTL. When, as shown in FIG. 4, WCTL attains the H level, all the NAND gates 40 output H level signals, thereby lowering the level of all the word lines Wi to the L level. Since the word lines perform memory cell selection at the H level, all of them are temporarily put in the nonselecting condition at the time of address change. As a result, when address change occurs, no memory cell is selected to bring about an unstable condition in the chips, thereby improving memory reliability.

As will be appreciated from FIG. 5, the CTL2 pulse is long at the time of address change, so that $\overline{CS}$ access takes less time than address access in respect of the time between the ATD pulse rise and the access completion. In the case of address access, the CTL2 pulse width must be of the same duration as in conventional cases so as to avoid malfunction. In view of this, at the time of the address change shown in FIG. 5, the CTL2 pulse width is set at approximately the same value as the CTL pulse of conventional memories. At the same time, the ATD pulse width is diminished and the operational speed of the address input buffer circuit and that of the decoder circuit increased so that $\overline{CSB}$ may fall sooner. Thus, in accordance with this invention, the $\overline{CSB}$ fall is earlier and the ATD pulse is shorter than in the conventional $\overline{CS}$ access, so that precharging and equalization are terminated earlier. By speeding up the operation of the address input buffer circuit and that of the decoder circuit, the $\overline{CS}$ access becomes faster. On the other hand, since a short ATD pulse is transformed into a sufficiently long one at the time of address access, the precharging and equalization of the data lines are positively performed, thereby avoiding malfunction.

As described above, this invention makes it possible to speed up access in the time of $\overline{CS}$ access while securing a sufficient length of time for precharging and equalization at the time of address access. At the time of $\overline{CS}$ access, the signal rise in the word lines and the column select lines can be made faster by speeding up the operation of the address input buffer circuit and that of the decoder circuit. Furthermore, since the operation of the amplifier and that of the output circuit are started with the precharging and equalization of the data lines promptly completed, the entire circuit can operate at a high speed, simultaneously with the rise of the word lines or that of the column select lines.

In addition, since a sufficient length of time can be secured for precharging and equalization at the time of address access, and consequently the word lines and the column select lines only rise after the data lines have attained a stable condition, amplification and output can be effected with stability without destroying the data in the memory cells. Furthermore, since all the word lines are temporarily put in the inactive condition at the time of address access, malfunction at the time of access can be avoided.

Since, in a semiconductor memory according to the present invention, buffer circuit 2 and pulse signal generating circuit 3 can operate faster than corresponding prior art circuits, such prior art circuits differ from those employed in the practice of the present invention in that the prior circuits have at least one of the following:

- two or four additional inverters in each channel;
- inverters having 30–50% longer gates;
- inverters having gate areas which are larger by approximately 40 $\mu^2$, with correspondingly larger capacitances.

This application relates to subject matter disclosed in Japanese Patent Application No. 094122/88, filed on Apr. 15, 1988, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor memory actuatable in response to a chip selection signal and address signals, comprising:
   a memory cell array having data lines;
   a selection signal generating circuit connected for generating an inner selection signal in response to the chip selection signal, the inner selection signal having an associated chip selecting state;
   a control signal generating circuit connected for detecting changes in the address signals and generating a first control signal in response to the change of each address signal used for the detection; and
   a signal changing circuit connected for deriving from said first control signal a second control signal for controlling said data lines of said memory cell array, a termination of the second control signal corresponding to a termination of said first control signal, wherein said signal changing circuit comprises means for delaying the termination of said second control signal relative to the termination of said first control signal when the inner selection signal is in the chip-selecting state.

2. A semiconductor memory as claimed in claim 1 wherein said signal changing circuit is operative to terminate said second control signal substantially simultaneously with the termination of said first control signal when inner selection signal is not in the chip-selecting state.

3. A semiconductor memory as claimed in claim 1 further comprising a data amplifier connected to said data lines and an output circuit connected to said data amplifier, and wherein said signal changing circuit is connected to said memory cell array, said amplifier and said output circuit such that said second control signal acts to precharge or equalize said data lines and to inhibit operation of said amplifier and said output circuit.

4. A semiconductor memory as claimed in claim 1 wherein said signal changing circuit comprises: first logical gate means connected for imparting a time delay to said first control signal when said inner selection signal is in the chip-selecting state; and
   second logical gate means connected to receive the delayed signal provided by said first logical gate means and the first control signal for effecting a logical disjunctive linkage of the delayed signal and the corresponding undelayed first control signal to thereby provide said second control signal.

5. A semiconductor memory as claimed in claim 1 wherein said memory cell array further has a first group of lines constituting word lines and a second group of lines constituting column select lines, and further comprising a selection line control circuit for generating a selection line control signal for deactivating at least one of said groups of lines of said memory cell array, said selection line control circuit comprising third logical gate means for deriving said selection line control signal from said first control signal when said inner selection signal is in the chip-selecting state.

6. A semiconductor memory as claimed in claim 5 further comprising a data amplifier, and wherein said memory cell array comprises a plurality of memory cells, a plurality of first transistors each having a control input connected to a respective word line and being disposed for connecting a respective memory cell to a respective data line, and a plurality of second transistors each having a control input connected to a respective column select line and being disposed for connecting a respective data line to said data amplifier.

7. A semiconductor memory comprising:
   a memory cell array; input terminals for receiving a chip selection signal and address signals;
   a selection signal generating circuit connected for generating an inner selection signal in response to the chip selection signal;
   a control signal generating circuit connected for detecting changes in the address signals and generating a first control signal in response to the change of each address signal used for the detection; and
   a signal width changing circuit connected for deriving from said first control signal a second control signal for controlling the operation of said memory cell array, wherein said signal width changing circuit comprises: first logical gate means connected for imparting a time delay to said first control signal when said inner selection signal is in the chip-selecting state; and second logical gate means connected to receive the delayed signal provided by said first logical gate means and the first control signal for effecting a logical disjunctive linkage of the delayed signal and the corresponding undelayed first control signal to thereby provide said second control signal.

8. A semiconductor memory as claimed in claim 7 wherein the inner selection signal has an associated chip-selecting state, and said memory cell array has a first group of lines constituting word lines and a second group of lines constituting column select lines, and further comprising a selection line control circuit for generating a selection line control signal for controlling at least one said group of lines, said selection line control circuit having means for placing said selection line control signal in a state to deactivate at least one of said groups of lines when said inner selection signal is in the chip-selecting state.

9. A semiconductor memory as claimed in claim 7 wherein the inner selection signal has an associated chip-selecting state and said first logical gate means are inhibited from producing an output when said inner selection signal is not in the chip-selecting state.

10. A semiconductor memory comprising:
a memory cell array; an input terminal for receiving a chip selection signal;
a control signal generating means connected for generating a first control signal at a first state immediately after said chip selection signal changes from a non-selecting state into a selecting state and at a second state for controlling the operation of said memory cell array in the selecting state;
a signal changing means connected for producing from said first control signal a second control signal for controlling the operation of said memory cell array, wherein said signal changing means comprising: first means connected for producing a delayed first control signal whose termination is delayed relative to termination of the first control signal; and second means connected for causing said second control signal to terminate upon termination of said first control signal at the first state and for causing said second control signal to terminate upon termination of the delayed first control signal at the second state.

11. A semiconductor memory as claimed in claim 10 wherein said memory cell array has a pair of data lines, and said second control signal acts to equalize the pair of data lines of the memory cell array.

12. A semiconductor memory as claimed in claim 11 wherein said control signal generating means is connected for receiving address signals and the chip selection signal from the input terminal, for detecting a change of the received address signals, and for generating said first control signal in response to the change detected.

13. A semiconductor memory comprising:
a memory cell array having word lines and data lines;
input terminals for receiving a chip selection signal and address signals;
a selection signal generating means connected for generating an inner selection signal in response to the chip selection signal, the inner selection signal having a selecting state and a non selecting state;
a control signal generating means connected for detecting a change in the address signals and generating a control pulse having a predetermined duration in response to detecting the change in the address signals;
a decoder connected to the word lines for selecting a word line based on the address signals; and means connected for inhibiting the operation of the decoder for selecting a word line during the predetermined duration in response to the control pulse, when the inner selection signal is in the selecting state.

14. A semiconductor memory as claimed in claim 13 wherein said memory cell array has a pair data lines, and said control pulse acts to equalize the pair of date lines of the memory cell array.

15. A semiconductor memory as claimed in claim 14 wherein said control signal generating means is operative for further detecting a change of the chip selection and generating the control pulse in response to detecting the change of the chip selection signal, and said decoder does not inhibit the operation for selecting a word line in response to the control pulse when the inner selection signal is in the non-selecting state.

* * * * *